United States Patent [19]

Brokaw

[11] Patent Number: 4,646,056
[45] Date of Patent: Feb. 24, 1987

[54] MATCHING OF RESISTOR SENSITIVITIES TO PROCESS-INDUCED VARIATIONS IN RESISTOR WIDTHS

[75] Inventor: Adrian P. Brokaw, Burlington, Mass.

[73] Assignee: Analog Devices, Inc., Norwood, Mass.

[21] Appl. No.: 831,870

[22] Filed: Feb. 24, 1986

Related U.S. Application Data

[62] Division of Ser. No. 765,809, Aug. 15, 1985, Pat. No. 4,586,019, which is a division of Ser. No. 423,255, Sep. 24, 1982, Pat. No. 4,565,000.

[51] Int. Cl.$^4$ ............................................. H01C 10/00
[52] U.S. Cl. ...................................... 338/195; 29/611; 338/48; 338/203; 338/320
[58] Field of Search ................. 338/48, 195, 203, 320; 29/611, 620; 219/543

[56] References Cited

U.S. PATENT DOCUMENTS

| | | | |
|---|---|---|---|
| 3,344,387 | 9/1967 | Kinkel et al. | 338/314 |
| 3,366,889 | 1/1968 | Avins | 330/19 |
| 3,403,324 | 9/1968 | Bradley | 323/80 |
| 3,431,640 | 3/1969 | Larsson | 29/620 |
| 3,644,802 | 2/1972 | Dingwall | 338/314 X |
| 4,161,742 | 7/1979 | Kane | 357/48 |
| 4,228,418 | 10/1980 | Piedmont et al. | 338/195 |

FOREIGN PATENT DOCUMENTS

| | | |
|---|---|---|
| 803669 | 1/1969 | Canada . |
| 2042550 | 2/1971 | France . |
| 48-26196 | 8/1973 | Japan . |
| 1396266 | 6/1975 | United Kingdom . |

Primary Examiner—C. L. Albritton
Attorney, Agent, or Firm—Parmelee, Bollinger & Bramblett

[57] ABSTRACT

A method is disclosed for matching the sensitivities of different-sized resistors to changes in resistance due to changes in width resulting from a systematic manufacturing error. In order to produce sets of resistors which can be deployed in predetermined ratios of resistance, the sensitivities of a matching resistor and a reference resistor are equalized by forming the matching resistor as a plurality of parallel strips as opposed to a unitary rectangular section.

1 Claim, 2 Drawing Figures

MATCHING OF RESISTOR SENSITIVITIES TO PROCESS-INDUCED VARIATIONS IN RESISTOR WIDTHS

This application is a division of application Ser. No. 765,809 filed Aug. 15, 1985, now U.S. Pat. No. 4,586,019, which is a division of application Ser. No. 423,255, filed Sept. 24, 1982, now U.S. Pat. No. 4,565,000.

BACKGROUND OF THE INVENTION

This invention relates to integrated circuit devices and, more particularly, to a method and a product formed thereby for matching the sensitivities of resistors to uniform manufacturing errors.

Many integrated circuit devices utilize pairs of resistors which must be deployed in critical, predetermined ratios of resistance. The proper operation of these circuits requires that these ratios fall within very narrow limits of error. While the ratios of resistance are critical, the individual values of resistance of the resistors which comprise the pairs are not critical. During the formation of these resistors, however, manufacturing processes result in a uniform, systematic error in the cutting or etching of the edges of the sections produced. This systematic error varies in magnitude from batch to batch of manufactured resistors, but is uniform within any one group. Since the etching error is always uniform within any one process group, paris of resistors can be deployed in predetermined ratios that will remain constant even after processing introduces the etching error. The design constraint of requiring highly accurate, predetermined ratios is thereby satisfied, although the cutting error causes the absolute values of the individual resistors in the pair to vary disproportionally.

A more general way of looking at the problem is to observe that various manufacturing steps affect the edges of resistors on any given chip in a uniform manner. If the resistors are over-etched, for example, each resistor will turn out to be less than the desired width by almost the same incremental amount. Since this amount depends very little on the design width of the resistor, it will affect different-sized resistors in different proportions. The resistance of wide resistors will be affected only a little, while that of narrow ones will be affected a great deal by the same fixed error in width.

Different-sized resistors sections, then, experience different relative changes in resistance due to this edge error. Given two rectangular sections of equal fixed lengths and widths W and 2W, an etching error, e, which affects each pair of edges would change the resistance of the section having width W twice as much as the resistance of the section having width 2W. The smaller of these two resistor sections is twice as sensitive to changes in resistance due to changes in width. For example, given one resistor 5 mils wide and another 10 mils wide, an etching error which causes a variation of width of 0.03 mil on each edge would result in changes in total resistance of $(0.03 \times 2)/5 = 1.2\%$ and $(0.03 \times 2)/10 = 0.6\%$ respectively.

Various methods can be used to circumvent this problem. For example, in the case of R-2R networks, resistors of one size only are often employed by joining two such resistors in series to form the 2R branches of this circuit. Uniform edge related errors may affect the total resistance of this network, but will not affect the critical R-2R ratio. Other special cases have particular solutions such as the use of numbers of identical resistors segments to form integral ratios other than two. When large or non-integral ratios are involved, however, fields of interconnected identical resistors become impractical.

An object of the present invention is to provide a method for equalizing or matching the sensitivities of different-sized resistors to relative changes in resistance resulting from changes in width. This method is useful in the process of manufacturing pairs of resistors which must have predetermined ratios of resistance within strict error limits. This ratio of resistance must be held at a predetermined constant despite the manufacturing error described above which introduces variations in width along each edge of the resistors and also changes the resistance of the resistors. Changes in the resistance of each resistor in the pair are acceptable so long as the ratio of the two resistance values remains constant after manufacture is completed.

DESCRIPTION OF THE PREFERRED EMBODIMENT

The method and product formed thereby which are disclosed may be utilized to match the sensitivities of different-sized resistors. For any rectangular section of resistor material, the resistance is given by the expression:

$$R = (\rho L)/W. \quad \text{Equation 1}$$

where
 $\rho$ = resistivity of the sheet
 L = length of the section, and
 W = width of the section.

The change in resistance due to a change in width is dR/dW, the first derivative of R with respect to W. For this specification and the appended claims, the term "sensitivity," denoted as S, is the quantity which serves as an index of the degree of variation of the total resistance of a resistor due to changes in its width. The sensitivity of a resistor, S, is defined as:

$$\frac{dR/dW}{R} = \frac{d(\rho L/W)/dW}{R} = \frac{-\rho L/W^2}{R} = \frac{-\rho L/W^2}{\rho L/W} = \frac{-1}{W}. \quad \text{Equation 2}$$

For a resistor with i rectangular sections each of the same length having combined width $$W_1 + W_2 + W_3 + \ldots + W_i = W,$$

the total sensitivity is given by the sum of the sensitivities of each section:

$$S = \frac{-i}{\text{Sum of widths}} \quad \text{Equation 3}$$

Resistor having $i$ sections, all lengths equal

For the more complex case of a resistor with i rectangular sections in series, each of different length and different width, the total sensistivity is given by another form of Equation 2:
Since for any section $$R = \frac{\rho L}{W} \quad \text{(Equation 1)}$$

$R = \rho L_1/W_1 + \rho L_2/W_2 + \ldots + \rho L_i/W_i.$
Resistor with $i$ sections, different lengths and widths Therefore $$S = \frac{\frac{-\rho L_1}{W_1^2} + \frac{-\rho L_2}{W_2^2} + \ldots + \frac{-\rho L_i}{W_i^2}}{R}$$

Resistor with $i$ sections, different lengths and widths

Which, by substitution, yields $$S = \frac{-\left(\frac{R_1}{W_1} + \frac{R_2}{W_2} + \ldots + \frac{R_i}{W_i}\right)}{R}. \quad \text{Equation 4.}$$

Resistor with $i$ sections

Throughout this specification, the method of the invention will be explained using a pair of resistors called a reference resistor, $R_r$, and a matching resistor, $R_m$. Given a pair of resistors $R_r$ and $R_m$ each having length L, resistivity $\rho$, widths a and b respectively, the sensitivities of $R_r$ and $R_m$ would be, according to Equation 2, $S_r = -1/a;$ $S_m = -1/b.$ In order to match the sensitivities, the ratio to $S_r$ to $S_m$ must be made to equal one. This is accomplished by dividing the larger of the two resistors $R_r$ or $R_m$ into n parallel sections where Equation 5

$n$ = integer which is approximately equal to the ratio $(S_r/S_m)$ when $S_r \geq S_m$; or $n$ = integer which is approximately equal to the ratio $(S_m/S_r)$ when $S_m > S_r$.

Figure 1:
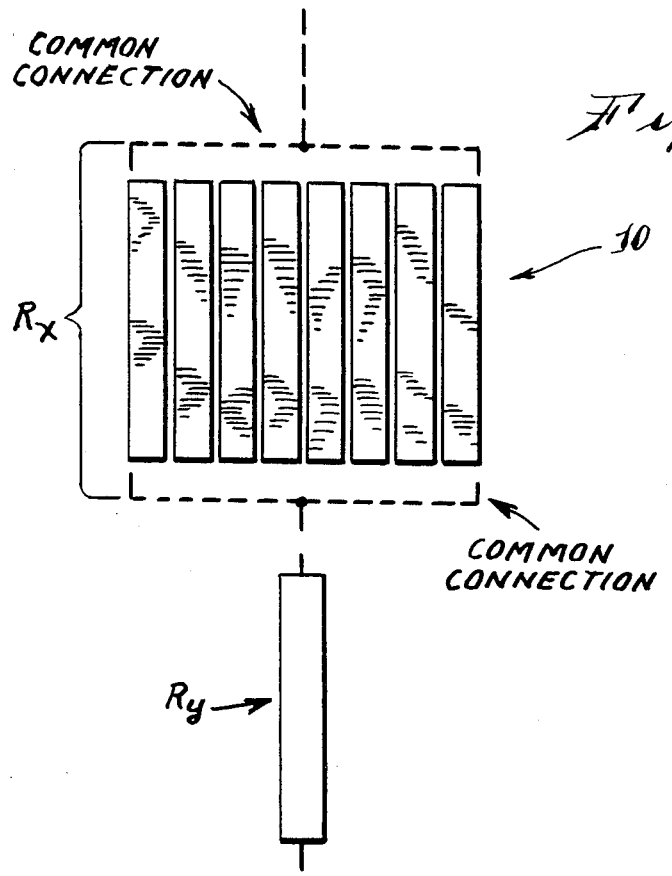
FIG. 1 is a pictorial showing of one embodiment of the invention.

If a wide resistor having low sensitivity to edge effects is to be matched to a narrower resistor with higher sensitivity, the wide resistor can be divided to increase its sensitivity. For example, given two resistors $R_x$ and $R_y$ of equal lengths L and widths of 4.0 mils and 0.5 mil respectively, Equation 2 yields $S_x = -1/4.0 \text{ mil} = -0.25 \text{ mil}^{-1},$ $S_y = -1/0.5 \text{ mil} = -2.0 \text{ mil}^{-1}.$ In order to match these two resistors, the wider resistor $R_x$ would be divided into eight parallel sections, as shown at 10 in FIG. 1. This results from the following calculation:
From Equation 5, $$n = \frac{S_y}{S_x} = \frac{2.0 \text{ mil}^{-1}}{0.25 \text{ mil}^{-1}} = 8.$$

These 8 sections may each be of equal width, i.e. 0.5 mil, or may be of different widths, depending upon layout requirements. The matching process, however, requires that the division in this case result in 8 sections. That is, the resistor which results from the division will have 8 times as many edges. Resistors $R_x$, which had 2 edges, will have 16 edges after division.

A more complex problem is presented by a resistor pair consisting of a first resistor having two series sections of different lengths and widths and a second having one section. If the first resistor, $R_c$, consists of sections 17.8 mils long by 0.5 mil wide and 9 mils long by 1.4 mils wide, the resistors will have separate resistance values of 35.60k$\Omega$ and 6.43K$\Omega$ respectively for a given, common resistivity. Due to an added discontinuity resistance of 0.42k$\Omega$ attributable to the junction of the two resistors, the combined series resistance of the two sections is 35.062k106 +6.43k$\Omega$+0.42k$\Omega$=42.45k$\Omega$. From Equation 4, $$S_c = \frac{-\left(\frac{35.60 \text{ k}\Omega}{0.5 \text{ mil}} + \frac{6.43 \text{ k}\Omega}{1.4 \text{ mil}}\right)}{42.45 \text{ k}\Omega},$$

$S_c = -1.79 \text{ mil}^{-1}.$

If resistor $R_c$ is to match a 250$\Omega$ resistor, $R_d$, which is 4 mils long, the 250$\Omega$ resistor must be divided. The resistor is 16 mils wide so that the sensitivity is 1/16=0.0625. The sensitivity of this resistor is 1.79/0.0625=28.64 times less than the 42k$\Omega$ resistor. Therefore, the 250$\Omega$ resistor should be divided into 28 or 29 sections.

Figure 2:
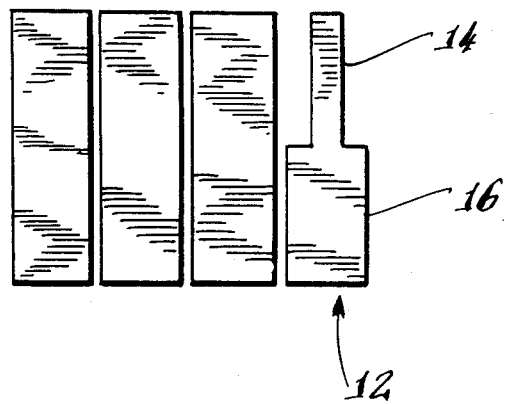
FIG. 2 is a pictorial showing of a modified form of the invention.

Although some inaccuracy is introduced in the example above by allowing the selection of either 28 or 29 divisions, the error is relatively slight. If, however, the number of divisions, n, is a relatively low number, such as 2.64, the error introduced by selecting n=2 or n=3 could be unacceptably high. To avoid that result, one of the parallel resistor sections could be formed of two series-arranged sub-sections of different widths. For example, as shown in FIG. 2, the section 12 could comprise adjoining rectangles 14 and 16 having parallel edges but different widths. Such a configuration would enable the designer to fabricate one section of non-uniform width which could contribute fractional sensitivity: one value of sensitivity due to its narrow end and another, different value of sensitivity due to its wide end. This arrangement could be utilized to account for the non-integral portion of the sensitivity ration, n, when that ratio is relatively low.

It is believed that the many advantages of this invention will now be apparent to those skilled in the art. It will also be apparent that a number of variations and modifications may be made in this invention without departing from its spirit and scope. Accordingly, the foregoing description is to be construed as illustrative only, rather than limiting. This invention is limited only by the scope of the following claims.

I claim:

1. In the art of making integrated-circuit chips having resistors thereon, a method of controlling the resistance ratio between a first resistor and a second resistor on the integrated-circuit chip, wherein said first resistor if formed as a single element would have a sensitivity of resistance change due to changes in width which is substantially less than the corresponding sensitivity of said second resistor, said resistance ratio being controlled by matching the sensitivity of said first resistor to changes in resistance due to changes in width to the corresponding sensitivity of said second resistor by a process wherein said first resistor is divided into a plurality of parallel-connected sections having a total width providing the same resistance as said single element but presenting an increased number of side edges relative to said single element to provide that the composite sensitivity of said parallel-connected resistor sections is increased and made at least substantially equal to said sensitivity of said second resistor;

the improved method comprising the steps of:

calculating the ratio of (1) said sensitivity of said second resistor to (2) said sensitivity of said hypothetical single-element first resistor; and setting the number of side edges to be presented by said parallel-connected sections to be at least substantially equal to twice said ratio.

* * * * *